United States Patent
Shi et al.

(10) Patent No.: US 11,149,933 B2
(45) Date of Patent: Oct. 19, 2021

(54) ELECTRICAL CONNECTOR AND LUMINAIRE ASSEMBLY

(71) Applicant: SUZHOU OPPLE LIGHTING CO., LTD., Suzhou (CN)

(72) Inventors: Xiufeng Shi, Shanghai (CN); Jianguo Li, Shanghai (CN)

(73) Assignees: Suzhou Opple Lighting Co., Ltd., Suzhou (CN); Opple Lighting Co., Ltd., Shanghai (CN)

( * ) Notice: Subject to any disclaimer, the term of this patent is extended or adjusted under 35 U.S.C. 154(b) by 0 days.

(21) Appl. No.: 16/692,611

(22) Filed: Nov. 22, 2019

(65) Prior Publication Data
US 2020/0088395 A1    Mar. 19, 2020

Related U.S. Application Data

(63) Continuation of application No. PCT/CN2018/086044, filed on May 8, 2018.

(30) Foreign Application Priority Data

May 24, 2017 (CN) .......................... 201710375113.3
May 24, 2017 (CN) .......................... 201720586549.2

(51) Int. Cl.
*F21V 23/06* (2006.01)
*H01R 12/71* (2011.01)
(Continued)

(52) U.S. Cl.
CPC ................ *F21V 23/06* (2013.01); *F21S 2/00* (2013.01); *F21S 4/28* (2016.01); *H01R 12/71* (2013.01);
(Continued)

(58) Field of Classification Search
CPC .......... F21V 23/06; H01R 12/71; F21S 2/005; F21S 4/28
See application file for complete search history.

(56) References Cited

U.S. PATENT DOCUMENTS 5,628,557 A * 5/1997 Huang ...................... F21S 2/00
                                                                    362/125
8,313,212 B1 * 11/2012 Mayer ....................... F21S 4/28
                                                                    362/219
(Continued)

FOREIGN PATENT DOCUMENTS

CN      104103919 A      10/2014
CN      105870749 A       8/2016
(Continued)

OTHER PUBLICATIONS

International Search Report of PCT Application No. PCT/CN2018/086044, dated Jul. 31, 2018 with English translation (6p).

*Primary Examiner* — Alexander K Garlen
(74) *Attorney, Agent, or Firm* — Arch & Lake LLP

(57) ABSTRACT

An electrical connector and luminaire assembly are provided. The electrical connector includes a base including a bottom wall and two side walls, the two side walls being on both sides of the bottom wall, and the bottom wall and the two side walls defining a receiving channel; a first printed circuit board fixed on the base, the first printed circuit board and the receiving channel being respectively located at two sides of the bottom wall; and a plurality of first conductive terminals electrically connected to the first printed circuit board and extending through the bottom wall of the base into the receiving channel.

19 Claims, 16 Drawing Sheets

(51) Int. Cl.
  *H01R 31/06* (2006.01)
  *H05K 1/18* (2006.01)
  *H05K 5/00* (2006.01)
  *F21W 121/00* (2006.01)
  *F21S 4/28* (2016.01)
  *F21S 2/00* (2016.01)

(52) U.S. Cl.
  CPC .............. *H01R 31/06* (2013.01); *H05K 1/18* (2013.01); *H05K 5/0069* (2013.01); *F21W 2121/004* (2013.01); *H05K 2201/10303* (2013.01)

(56) References Cited

U.S. PATENT DOCUMENTS

| | | | |
|---|---|---|---|
| 9,267,653 | B2 | 2/2016 | Benner |
| 10,125,964 | B2 * | 11/2018 | Camarota ................ F21V 23/06 |
| 2010/0279539 | A1 * | 11/2010 | Lo ........................ H01R 13/506 |
| | | | 439/426 |
| 2015/0241035 | A1 * | 8/2015 | Dankelmann ........... F21V 23/06 |
| | | | 362/219 |
| 2016/0356470 | A1 * | 12/2016 | Noh ........................ F21S 4/28 |
| 2017/0268760 | A1 * | 9/2017 | Xu ........................ H05B 47/19 |
| 2018/0172257 | A1 * | 6/2018 | Hierzer .................... F21S 4/28 |
| 2018/0219339 | A1 * | 8/2018 | Zhang ................... H01R 13/512 |

FOREIGN PATENT DOCUMENTS

| | | |
|---|---|---|
| CN | 205560456 U | 9/2016 |
| CN | 206159954 U | 5/2017 |
| CN | 107228300 A | 10/2017 |
| CN | 206771116 U | 12/2017 |

* cited by examiner

US 11,149,933 B2

ELECTRICAL CONNECTOR AND LUMINAIRE ASSEMBLY

CROSS-REFERENCE TO RELATED APPLICATION

This application is based upon and claims priority to PCT patent application No. PCT/CN2018/086044 filed on May 8, 2018 which claims the priority of Chinese Patent Application No. 201720586549.2, filed on May 24, 2017, and Chinese Patent Application No. 201710375113.3 filed on May 24, 2017, the entire contents thereof are incorporated herein by reference.

TECHNICAL FIELD

The present disclosure relates to a technical field of lighting, and in particular, to an electrical connector and a luminaire assembly.

BACKGROUND

In recent years, luminaires of different grades, different forms, or different usages have been continuously developed. For example, wall washer lights, as a kind of luminaires, are widely used for architectural decorative lighting, KTV entertainment places, bridge piers, or the like, and are capable of outlining a shape of a building. Energy-saving and environmentally friend wall washer lights have been widely replaced by LED wall washer lights. In order to achieve a good wall washing effect, the wall washer lights are usually in a form of an assembly by assembling a plurality of luminaires. However, in current domestic and foreign markets, during the luminaire assembly is installed, the luminaires of the luminaire assembly are usually firstly installed and then are connected by wires. Such assembling process is inconvenient, and the wires are intended to be exposed and complicated to affect the appearance.

SUMMARY

In view of the above problems, the present disclosure provides an electrical connector that enables quick connection between luminaires without manual wiring connection.

The embodiments of the present disclosure also provide a luminaire assembly.

The embodiments of the present disclosure includes the following: an electrical connector mounted on an installation foundation comprises: a base comprising a bottom wall and two side walls, the two side walls being on two sides of the bottom wall, and the bottom wall and the two side walls defining a receiving channel; a first printed circuit board fixed on the base, the first printed circuit board and the receiving channel being respectively located at two sides of the bottom wall; and a plurality of first conductive terminals electrically connected to the first printed circuit board and extending through the bottom wall of the base into the receiving channel.

A luminaire assembly comprises the electrical connector as described above and a light source assembly detachably assembled in the receiving channel, the electrical connector is assembled with the light source assembly, and the light source assembly is mounted on the installation foundation by the electrical connector.

A luminaire assembly comprises two of the electrical connector as described above, two light source assemblies and two interface assemblies, one end of the receiving channel of each electrical connector is detachably assembled with one of the two light source assemblies, the other end of the receiving channel of each electrical connector is detachably assembled with one of the two interface assemblies, and the two interfaces circuits are electrically connected.

Hereinafter, specific embodiments of the present disclosure will be described in detail in conjunction with the accompanying drawings, so that the above-described and other purposes, features and advantages of the present disclosure are more obvious to those skilled in the art.

BRIEF DESCRIPTION OF THE DRAWINGS

The drawings described herein are intended to provide a further understanding of the present disclosure, the illustrative embodiments of the present disclosure and the description thereof are intended to explain the present disclosure and are not intended to limit the disclosure. In the drawings.

DETAILED DESCRIPTION

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the disclosure. Instead, they are merely examples of apparatuses and methods consistent with aspects related to the disclosure as recited in the appended claims.

The terminology used in the present disclosure is for the purpose of describing particular embodiments only and is not intended to limit the present disclosure. As used in the present disclosure and the appended claims, the singular forms "a," "an," and "the" are intended to include the plural forms as well, unless the context clearly indicates otherwise. It shall also be understood that the term "and/or" used herein is intended to signify and include any or all possible combinations of one or more of the associated listed items.

It shall be understood that, although the terms "first," "second," "third," etc. may be used herein to describe various information, the information should not be limited by these terms. These terms are only used to distinguish one category of information from another. For example, without departing from the scope of the present disclosure, first information may be termed as second information; and similarly, second information may also be termed as first information. As used herein, the term "if" may be understood to mean "when" or "upon" or "in response to a judgment" depending on the context.

It is apparent that the described embodiments are only a part of the embodiments of the present disclosure, and not all of the embodiments. All other embodiments obtained by those skilled in the art based on the embodiments of the present disclosure without creative efforts are within the scope of the present disclosure.

Figure 1:
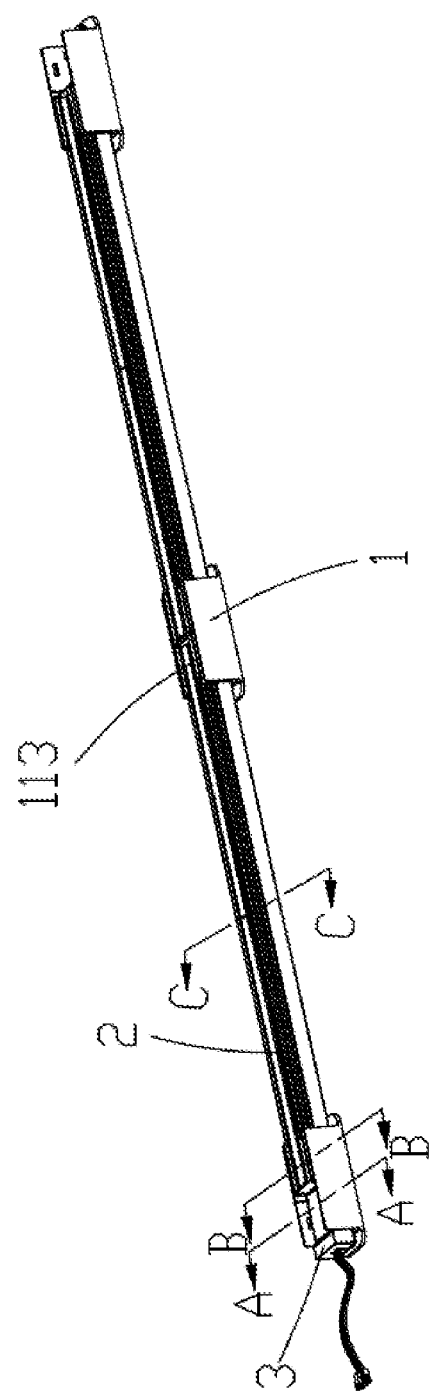
FIG. 1 is a perspective schematic view of a luminaire assembly, according to an example of the present disclosure.
Figure 2:
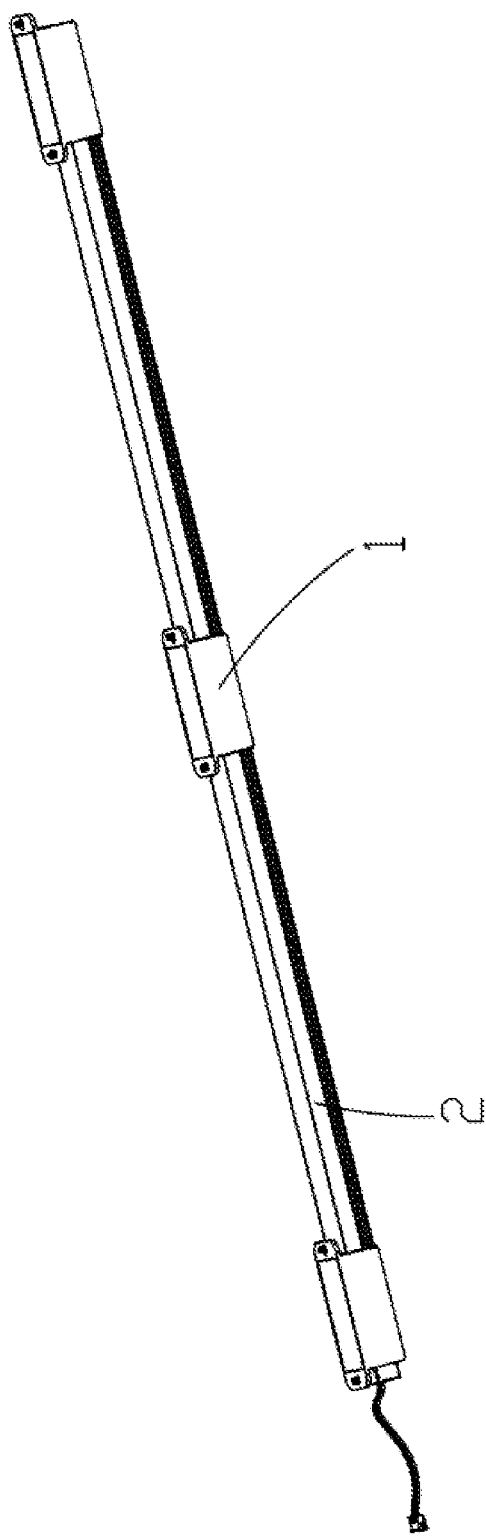
FIG. 2 is a perspective schematic view of the luminaire assembly of FIG. 1 viewed at another angle, according to an example of the present disclosure.

As shown in FIG. 1 and FIG. 2, the example of the present disclosure provides a luminaire assembly including three electrical connectors 1, two light source assemblies 2, and an interface assembly 3. The three electrical connectors 1 are assembled with the two light source assemblies 2, and the two light source assemblies 2 are electrically connected by one electrical connector 1. The three electrical connectors 1 are respectively located at a junction of the two light source assemblies and two ends of the two light source assemblies which have been assembled. The light source assembly 2 is mounted on an external installation foundation via the electrical connector 1. One end of the interface assembly 3 is connected to the electrical connector 1 provided at one side. The other end of the interface assembly 3 is connected to an external power source to supply a power to the two light source assemblies 2. Specifically, one ends of the two light source assemblies 2 are respectively received and mounted at two ends of the electrical connector 1 at the intermediate position of the luminaire assembly, and the other ends of the two light source assemblies 2 are respectively received and mounted at two electrical connectors 1 located at two sides, and the interface assembly 3 is mounted on an electrical connector 1 located at one side. In this embodiment, the luminaire assembly can include a wall washer light assembly for architectural decorative lighting.

The following is a detailed description of the various components in the luminaire assembly and the connection relationships between the various components.

Figure 3:
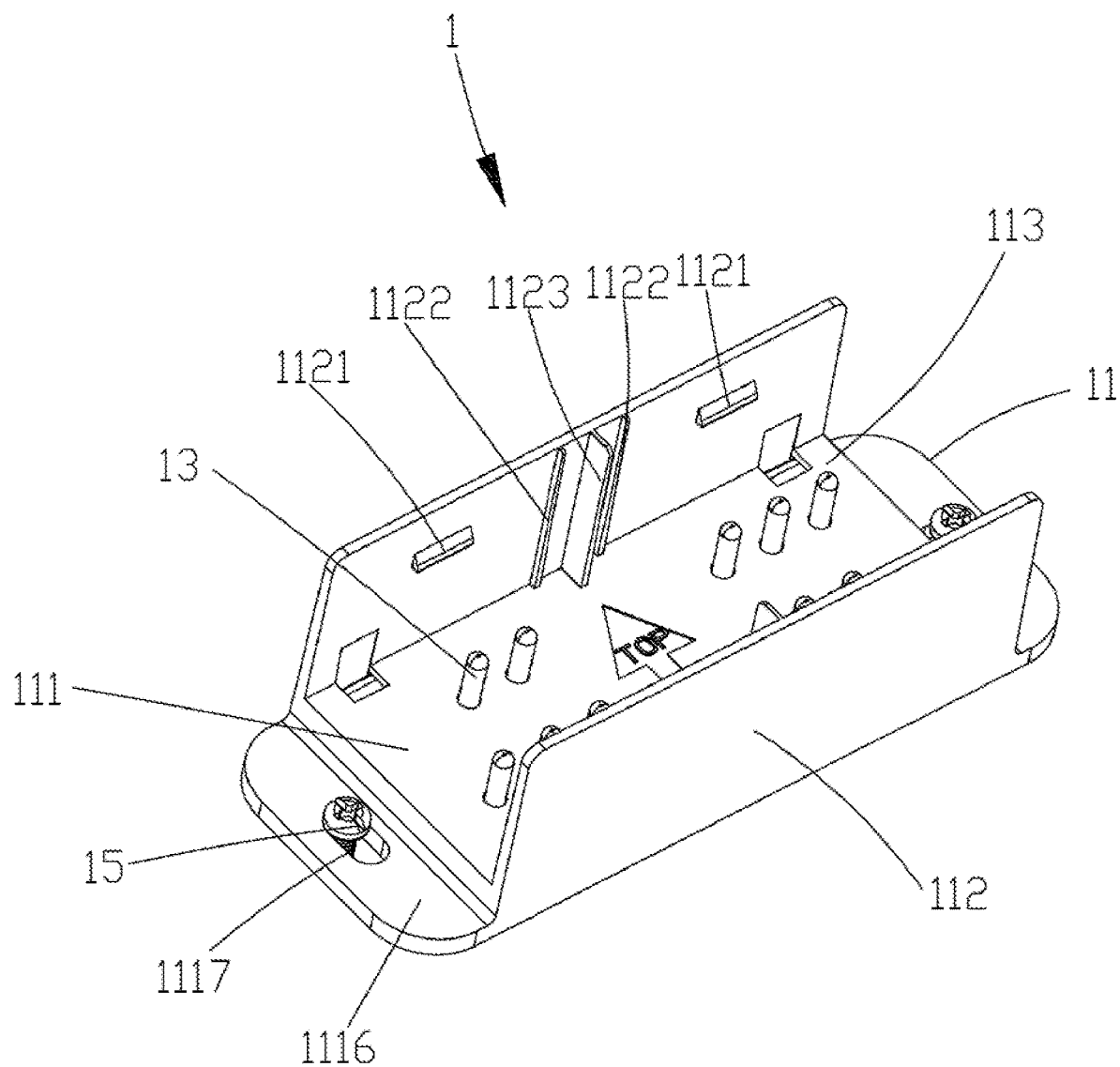
FIG. 3 is a perspective schematic view of an electrical connector of FIG. 1, according to an example of the present disclosure.
Figure 6:
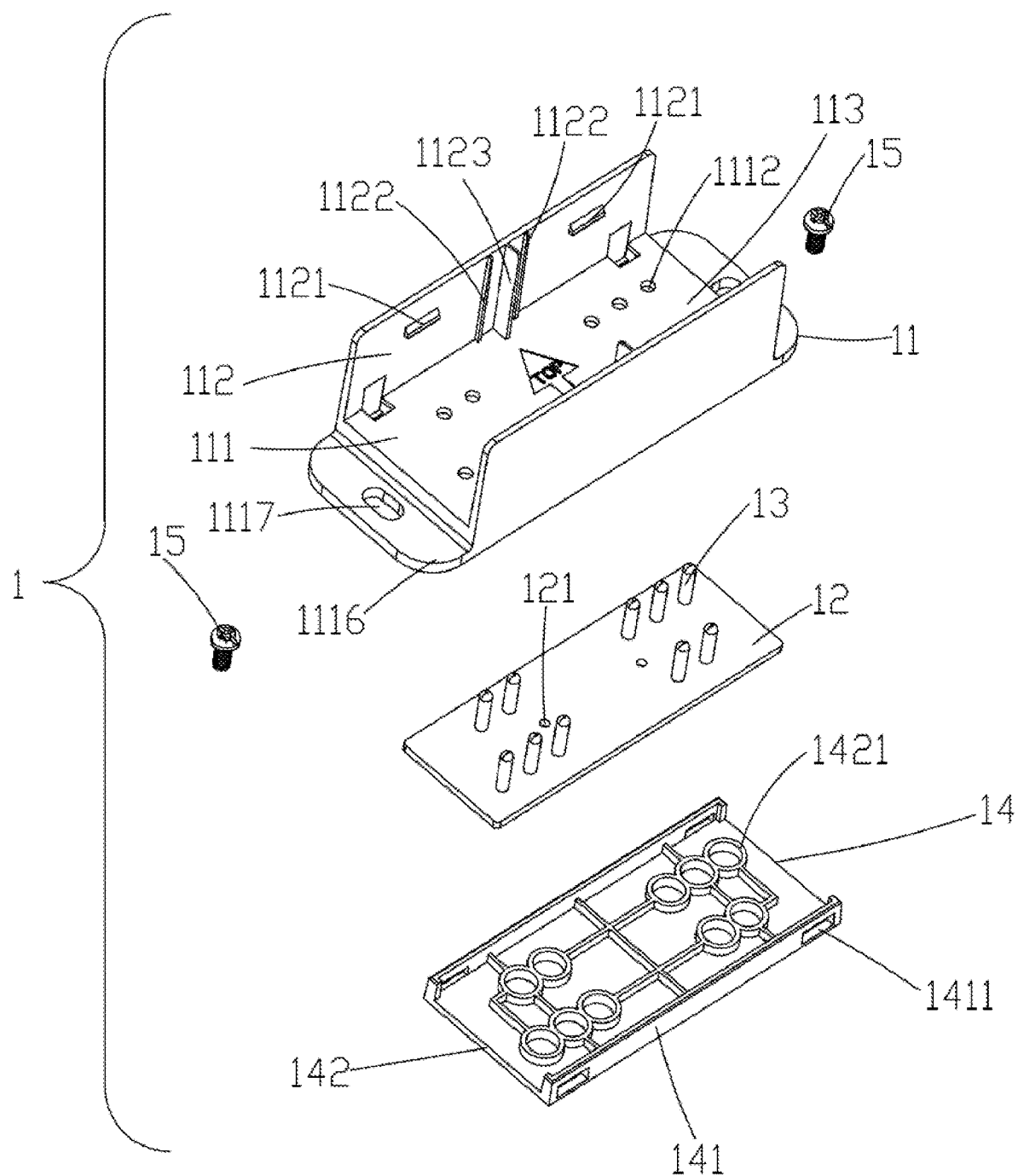
FIG. 6 is an exploded perspective view of the electrical connector of FIG. 3, according to an example of the present disclosure.
Figure 7:
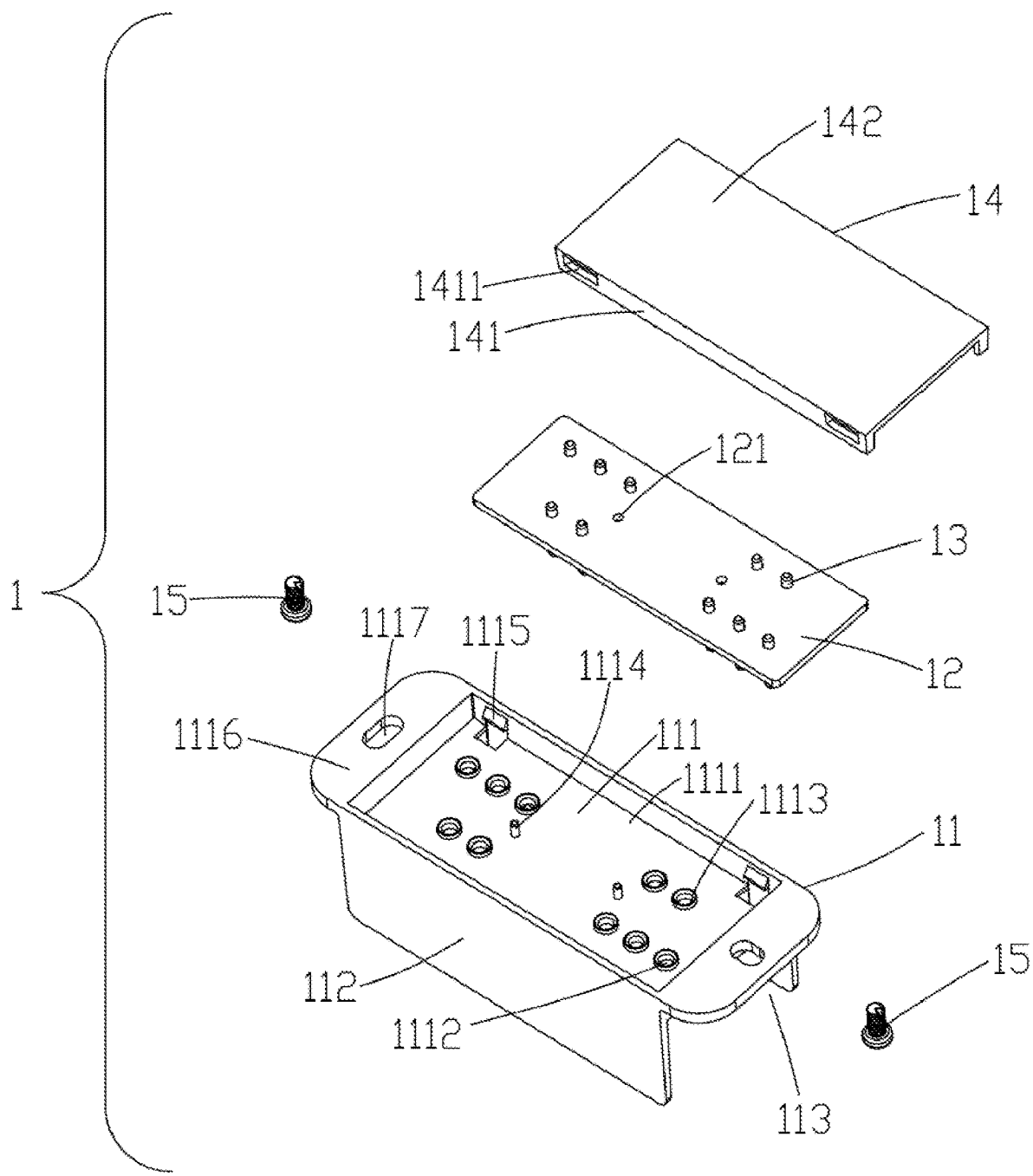
FIG. 7 is an exploded perspective view of the electrical connector of FIG. 6 viewed at another angle, according to an example of the present disclosure.

As shown in FIG. 3, FIG. 6 and FIG. 7, the electrical connector 1 includes a base 11, a first printed circuit board 12 received in the base 11, two sets of first conductive terminals 13 electrically connected to the first printed circuit board 12, a pressure plate 14 assembled under the base 11 and fixing the first printed circuit board 12 to the base 11, and a connecting member 15 for fixing the base 11 to the installation foundation (such as the ground). By the electrical connector 1, two adjacent light source assemblies 2 are electrically connected. Specifically, the first conductive terminal 13 of the embodiment is a copper pin.

As shown in FIG. 6, the base 11 includes a bottom wall 111 and two side walls 112 on both sides of the bottom wall 111. Further, the base 11 is further provided with a receiving channel 113 surrounded by the bottom wall 111 and the two side walls 112. The first printed circuit board 12 and the receiving channel 113 are respectively located on two sides of the bottom wall 111.

As shown in FIG. 7, a lower surface of the bottom wall 111 is inwardly recessed to form a receiving slot 1111, and the receiving slot 1111 is configured to receive the first printed circuit board 12. A plurality of first terminal holes 1112 extending in the up and down direction are further formed in the bottom wall 111. The plurality of first conductive terminals 13 disposed on the first printed circuit board 12 pass through the first terminal holes 1112 of the bottom wall 111 and extend into the receiving channel 113. A plurality of first annular ribs 1113 respectively corresponding to the plurality of first terminal holes 1112 are further disposed in the receiving slot 1111 of the bottom wall 111. The first annular rib 1113 is disposed at a periphery of the first terminal hole 1112. Because the first annular ribs 1113 are disposed in the receiving slot 1111, the first printed circuit board 12 abuts on the plurality of the first annular ribs 1113 if the first printed circuit board 12 is received in the receiving slot 1111. A plurality of first positioning protrusions 1114 are provided on an inner side surface of the receiving slot 1111 of the bottom wall 111, and the first printed circuit board 12 is provided with first positioning holes 121 respectively corresponding to the first positioning protrusions 1114. Two opposite pairs of second fixture blocks 1115 are inwardly provided on the inner side surface of the receiving slot 1111 of the bottom wall 111. Two connecting portions 1116 are further provided on two sides of the bottom wall 111, a first through hole 1117 is formed in each of the two connecting portions 1116, the connecting member 15 passes through the first through hole 1117 to fix the base 11 to the installation foundation (not shown), thereby the light source assembly 2 is mounted on the external installation foundation by the electrical connector 1.

As shown in FIG. 6, the two side walls 112 respectively are provided with a fixing structure extending into the receiving channel 113. Two opposite pairs of first fixture blocks 1121 are inwardly provided on the two side walls 112. The first fixture block 1121 is the above-mentioned fixing structure. The fixing structure, that is, the first fixture block 1121, enables the electrical connector 1 to mechanically fix one end of the light source assembly 2 or the interface assembly 3 in the receiving channel 113. The inner surface of each side wall 112 is further provided with two first positioning ribs 1122 extending inwardly. The inner surfaces of the two side walls 112 are provided with a pair of partition plates 1123 extending inwardly, and the two first fixture blocks 1121 are respectively located on two sides of the partition plate 1123 on each side wall 112. The two first positioning ribs 1122 on each side wall 112 are also respectively located on two sides of the partition plate 1123 on the side wall, and the first positioning rib 1122 is used to limit the location of the light source assembly 2 or the interface assembly 3 located on two sides of the partition plate 1123.

Figure 12:
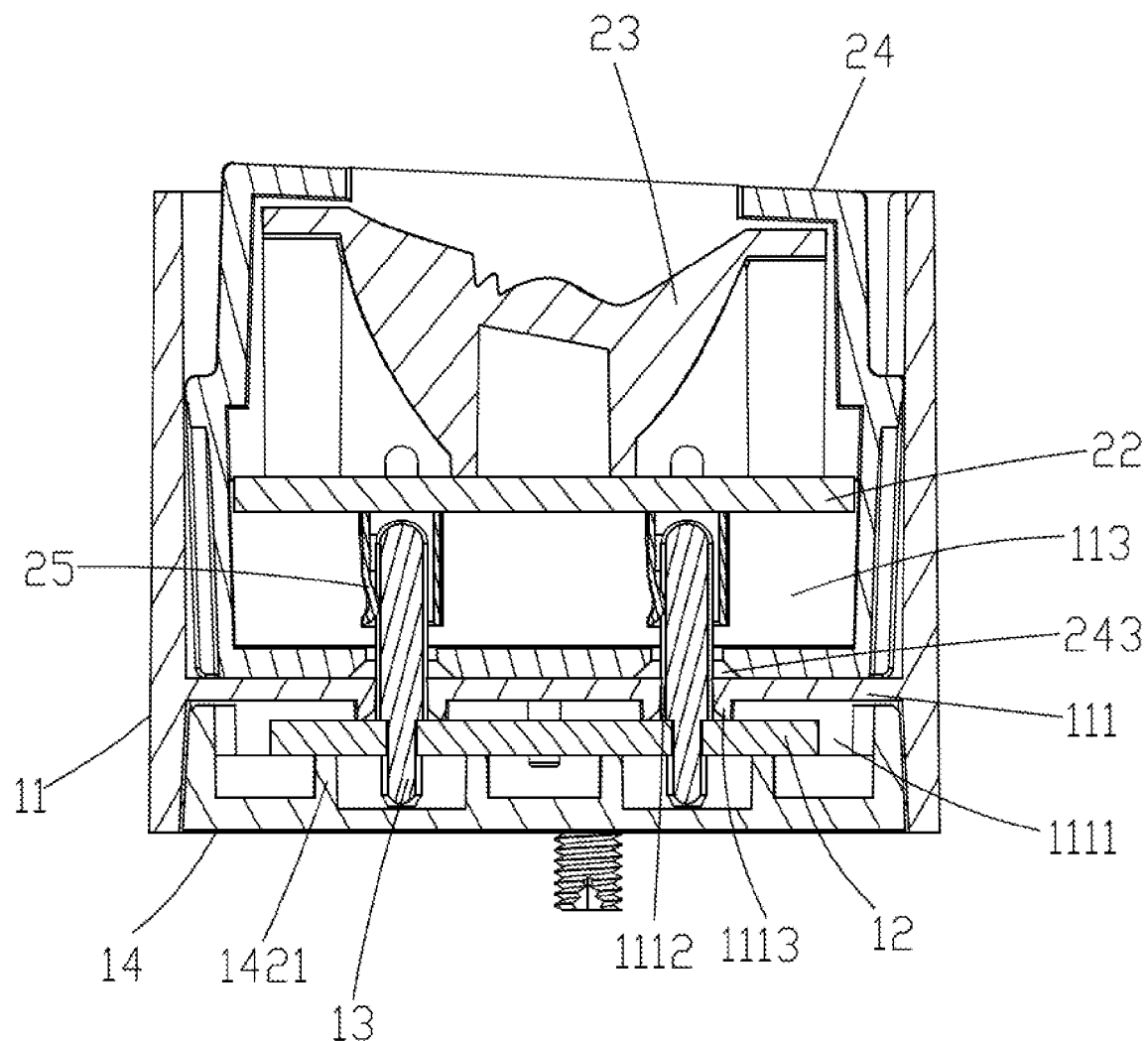
FIG. 12 is a cross-sectional view taken along line A-A of FIG. 1, according to an example of the present disclosure.

Referring to FIG. 12, two sets of the first conductive terminals 13 are provided, and the two sets of first conductive terminals 13 are respectively located at two ends of the first printed circuit board 12, and extend from the receiving slot 1111 into the receiving channel 113 via the first terminal holes 1112 of the bottom ball 111.

As shown in FIG. 6, the pressure plate 14 includes two opposite side plates 141, and each of the side plates 141 is provided with a buckle hole 1411 corresponding to the second fixture block 1115. Specifically, the second fixture block 1115 is snap-fitted with the buckle hole 1411 so that the base 11 and the pressure plate 14 are fixedly connected together, and the first printed circuit board 12 is sealed and fixed in the receiving slot 1111 (refer to FIG. 12). The pressure plate 14 further includes a bottom plate 142 connecting the two side plates 141. The inner surface of the bottom plate 142 is formed with a plurality of second annular rib 1421 abutting on the first printed circuit board. The second annular ribs 1421 together with the first annular ribs 1113 limit a position of the first printed circuit board 12 in the receiving slot 1111 to prevent the first printed circuit board 12 from moving within the receiving slot 1111 (refer to FIG. 12).

During the electrical connector 1 is assembled, the first conductive terminals 13 are first welded to the first printed circuit board 12; then the first printed circuit board 12 is placed in the receiving slot 1111, the first positioning protrusions 1114 of the bottom wall 111 are inserted into the first positioning holes 121 of the first printed circuit board 12 and the first conductive terminals 13 on the first printed circuit board 12 extend from the receiving slot 1111 into the receiving channel 113 through the first terminal holes 1112 of the bottom wall 111; finally, the pressure plate 14 is snap-fitted with the base 11.

Through the above steps, the assembling of the electrical connector 1 is completed.

As shown in FIG. 1, one end of the light source assembly 2 is detachably assembled in the receiving channel 113 and electrically connected to the electrical connector 1. The two light source assemblies 2 in the luminaire assembly provided by this embodiment are electrically connected by one electrical connector 1.

Figure 4:
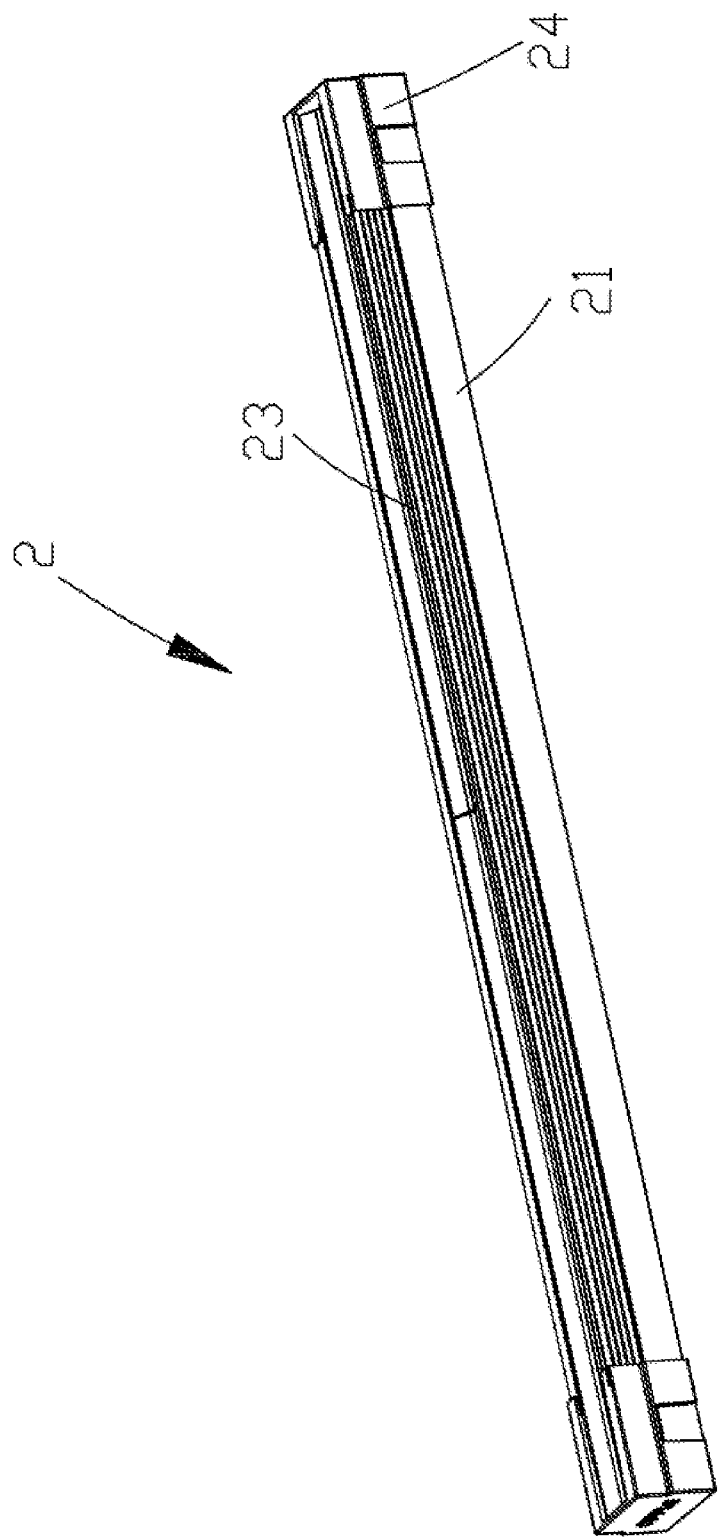
FIG. 4 is a perspective schematic view of a light source assembly of FIG. 1, according to an example of the present disclosure.
Figure 8:
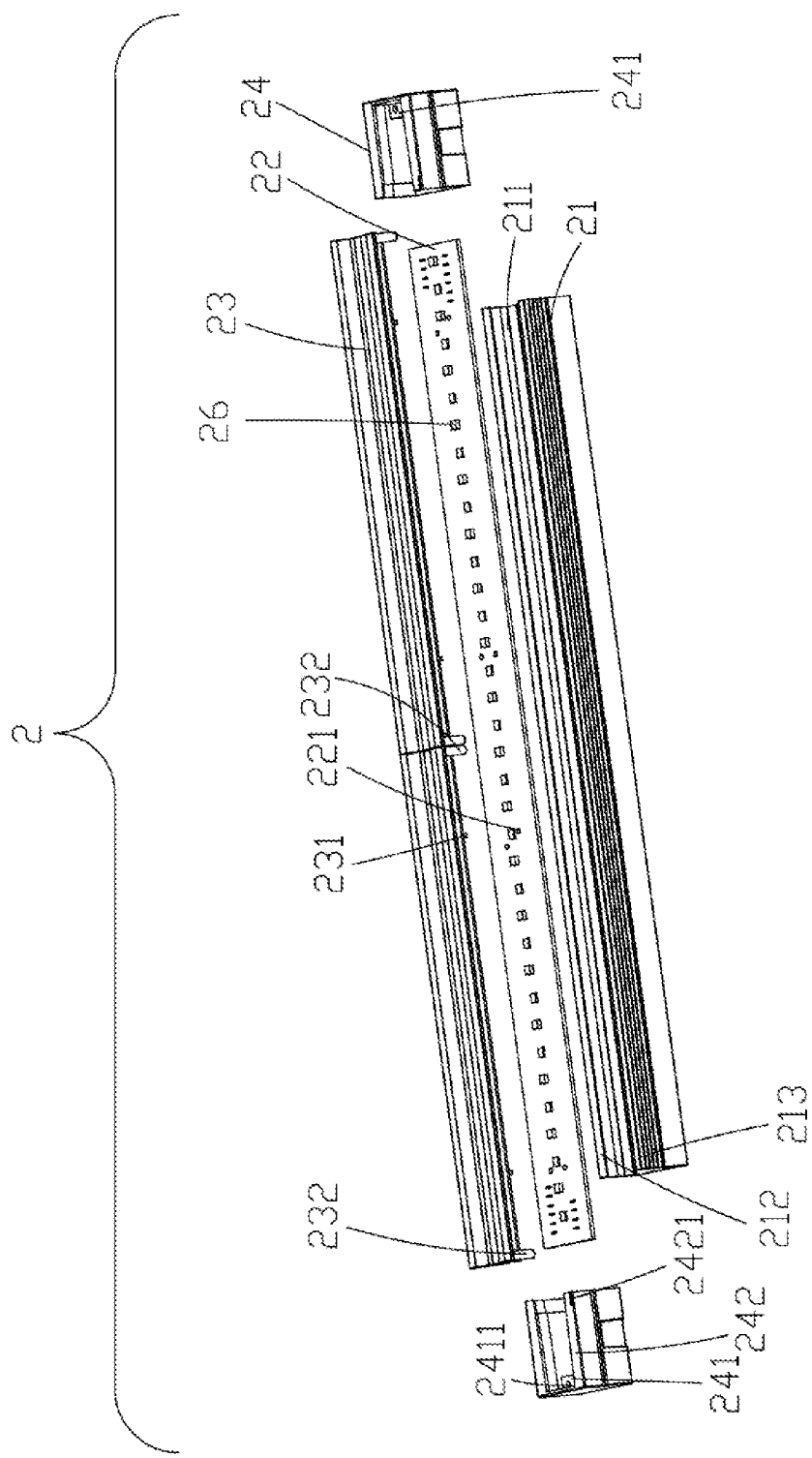
FIG. 8 is an exploded perspective view of the light source assembly of FIG. 1, according to an example of the present disclosure.
Figure 9:
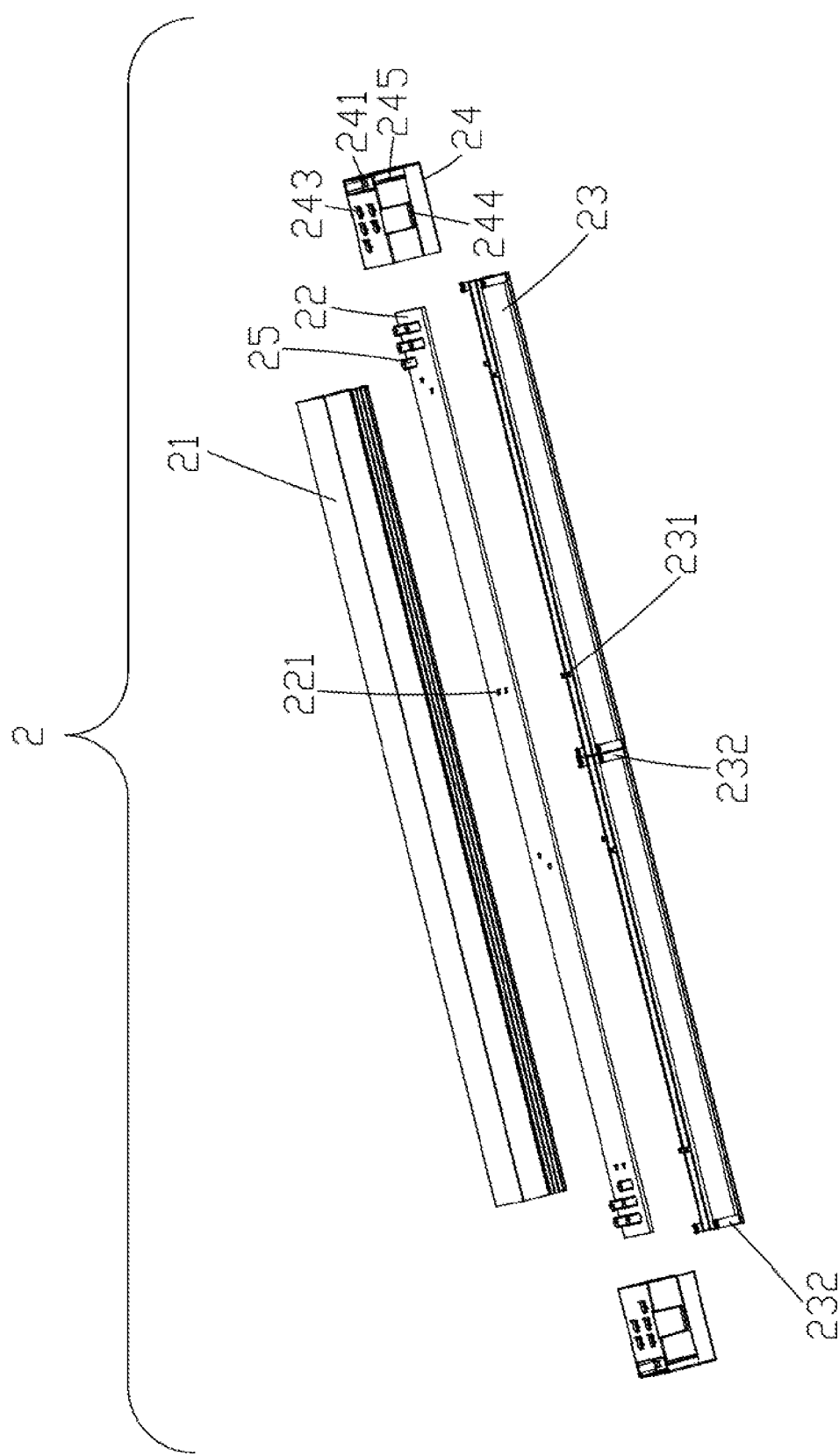
FIG. 9 is an exploded perspective view of the light source assembly of FIG. 8 viewed at another angle, according to an example of the present disclosure.

Specifically, as shown in FIG. 4, FIG. 8 and FIG. 9, the light source assembly 2 includes a pedestal 21, a light source substrate 22, a lens 23, an end cover 24, two sets of second conductive terminals 25 and a plurality of light sources 26, the light source substrate 22 and the lens 23 are received in the pedestal 21, the end cover 24 seals the end of the pedestal 21, the two sets of second conductive terminals 25 are welded on two ends of the lower surface of the light source substrate 22 and received in the end cover 24, the plurality of light sources 26 are welded on the upper surface of the light source substrate 22, the lens 23 is combined with the end cover 24 and the pedestal 21 to enclose the light source substrate 22 in the light source assembly 2. Specifically, the pedestal 21 is an aluminum pedestal, and the second conductive terminal 25 is a copper pin.

Figure 14:
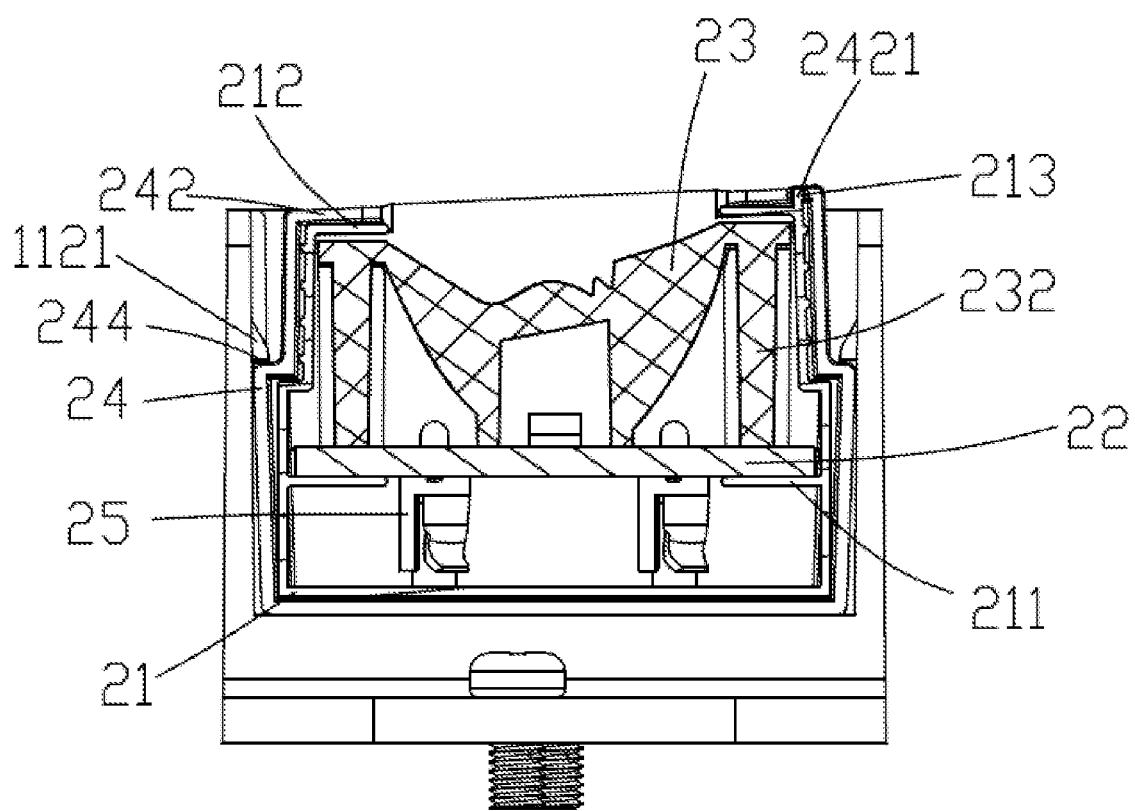
FIG. 14 is a cross-sectional view taken along line C-C of FIG. 1, according to an example of the present disclosure.

As shown in FIG. 8, the pedestal 21 is a substantially U-shaped frame, and includes a bottom wall (not labeled in the drawing), two side walls (not labeled in the drawing) on two sides of the bottom wall, two opposite support plates 211 disposed on the two side walls and two opposite first limiting plates 212 disposed on the two side walls. Referring to FIG. 14, the light source substrate 22 and the lens 23 are sandwiched between the support plate 211 and the first limiting plate 212. The two support plates 211 respectively support two sides of the light source substrate 22, and the lens 23 is disposed above the light source substrate 22. Further, the pedestal 21 is further provided with a vertical second positioning rib 213, and the second positioning rib 213 is cooperated with the end cover 24.

As shown in FIG. 8, the light source substrate 22 is provided with a plurality of second positioning holes 221 for positioning with respect to the lens 23. The light source substrate 22 may be an aluminum substrate or a printed circuit board.

As shown in FIG. 8, the lens 23 is a stretch type light distribution regulation element and has a long strip shape. The lens 23 is disposed above the light source substrate 22 and is configured for second light distribution regulation of the light emitted by the light sources 26 so that the light is concentrated toward the wall to be washed. The lower surface of the lens 23 is provided with second positioning protrusions 231 that cooperate with the second positioning holes 221 on the light source substrate 22. A plurality of positioning posts 232 are disposed on the lower surface at the two sides of the lens 23, a portion of the positioning posts 232 abuts on the light source substrate 22 (refer to FIG. 14), and a portion of the positioning posts 232 is configured for positioning with respect to the end cover 24. The light source assembly 2 provided in this embodiment includes two adjacently disposed lenses 23 so that the light source substrate 22 is completely covered. Of course, in an alternative embodiment, the lens 23 may be one lens that completely covers the light source substrate 22.

As shown in FIG. 8 and FIG. 9, the end cover 24 is provided with a receiving cavity (not labeled in the drawings) for receiving one end of the light source substrate 22 and one end of the lens 23, a positioning block 241 is located in the receiving cavity, a second limiting plate 242 is located in the receiving cavity and is configured for restricting the movement of the pedestal 21 in the up and down direction, a second terminal hole 243 is formed at the bottom of the end cover 24, a step portion 244 is formed within one side surface of the end cover 24, a first groove 245 is formed on an outer surface of two side surfaces adjacent to the side surface provided with the step portion 244. Two ends of the light source substrate 22 respectively abut on the side surface of the positioning block 241.

As shown in FIG. 8, the positioning block 241 is provided with a third positioning hole 2411 that cooperates with a portion of the positioning posts 232 below the lens 23, such that the lens 23 is further assembled and positioned with the end cover 24. The positioning block 241 is provided with the third positioning hole 2411 corresponding to the positioning post 232. The diameter of the third positioning hole 2411 is the same as the inner diameter of the positioning post 232. A connecting member such as a screw passes through the third positioning hole 2411 and the positioning post 232 to fix the lens 23 and the end cover 24. Referring to FIG. 14, the second limiting plate 242 is in contact with the first limiting plate 212 and located above the first limiting plate 212. At the same time, one end of the second limiting plate 242 is further provided with a second groove 2421 that cooperates with the second positioning rib 213. The second positioning rib 213 is inserted into the second groove 2421, and the pedestal 21 and the end cover 24 are assembled together in the length direction of the light source assembly 2.

As shown in FIG. 9, a plurality of second terminal holes 243 are formed at the bottom of each end cover 24 to correspond to the second conductive terminal 25. One set of first conductive terminals 13 on the electrical connector 1 are inserted into the second conductive terminals 25 through the second terminal holes 243 to realize an electrical connection between the light source assembly 2 and the electrical connector 1 (refer to FIG. 12). At the same time, the end cover 24 is located at the end of the light source assembly 2, and is detachably assembled in the receiving channel 113 of the electrical connector 1. The side surface of the end cover 24 is provided with the step portion 244 correspond to the first fixture block 1121, and the side surface of the end cover 24 is provided with first groove 245 correspond to the first positioning rib 1122. During the electrical connector 1 is assembled with the light source assembly 2, the first positioning rib 1122 is inserted into the first groove 245 to position the light source assembly 2 and the electrical connector 1 with each other. The first fixture block 1121 and the step portion 244 are snap-fitted with each other (refer to FIG. 14), and the light source assembly 2 is fixed in the electrical connector 1 to complete the assembly. At this time, one set of first conductive terminals 13 are inserted into the second conductive terminals 25.

During the light source assembly 2 is assembled, the second conductive terminals 25 are first welded to the light source substrate 22; the second positioning protrusion 231 of the lens 23 is inserted into the second positioning hole 221 of the light source substrate 22, one end of a portion of the positioning posts 232 is supported on the light source substrate 22, and one end of a portion of the positioning posts 232 is supported on the positioning block 241 of the end cover 24, and the lens 23 and the light source substrate 22 are assembled; then the combination of the lens 23 and the light source substrate 22 is inserted into the pedestal 21, the top of the lens 23 is held by the two first limiting plates 212 of the pedestal 21, and the two support plates 211 of the pedestal 21 directly support the light source substrate 22; finally, the end cover 24 and the pedestal 21 are combined, the two second limiting plates 242 of the end cover 24 cover the first limiting plates 212 of the pedestal 21, the second positioning rib 213 of the pedestal 21 is inserted into the second groove 2421 of the end cover 24, and the second conductive terminal 25 welded on the light source substrate 22 is directly opposite to the second terminal hole 243 of the end cover 24.

As shown in FIG. 1, the interface assembly 3 and the light source assembly 2 are simultaneously detachably assembled in the receiving channel 113 and electrically connected to the electrical connector 1.

Figure 5:
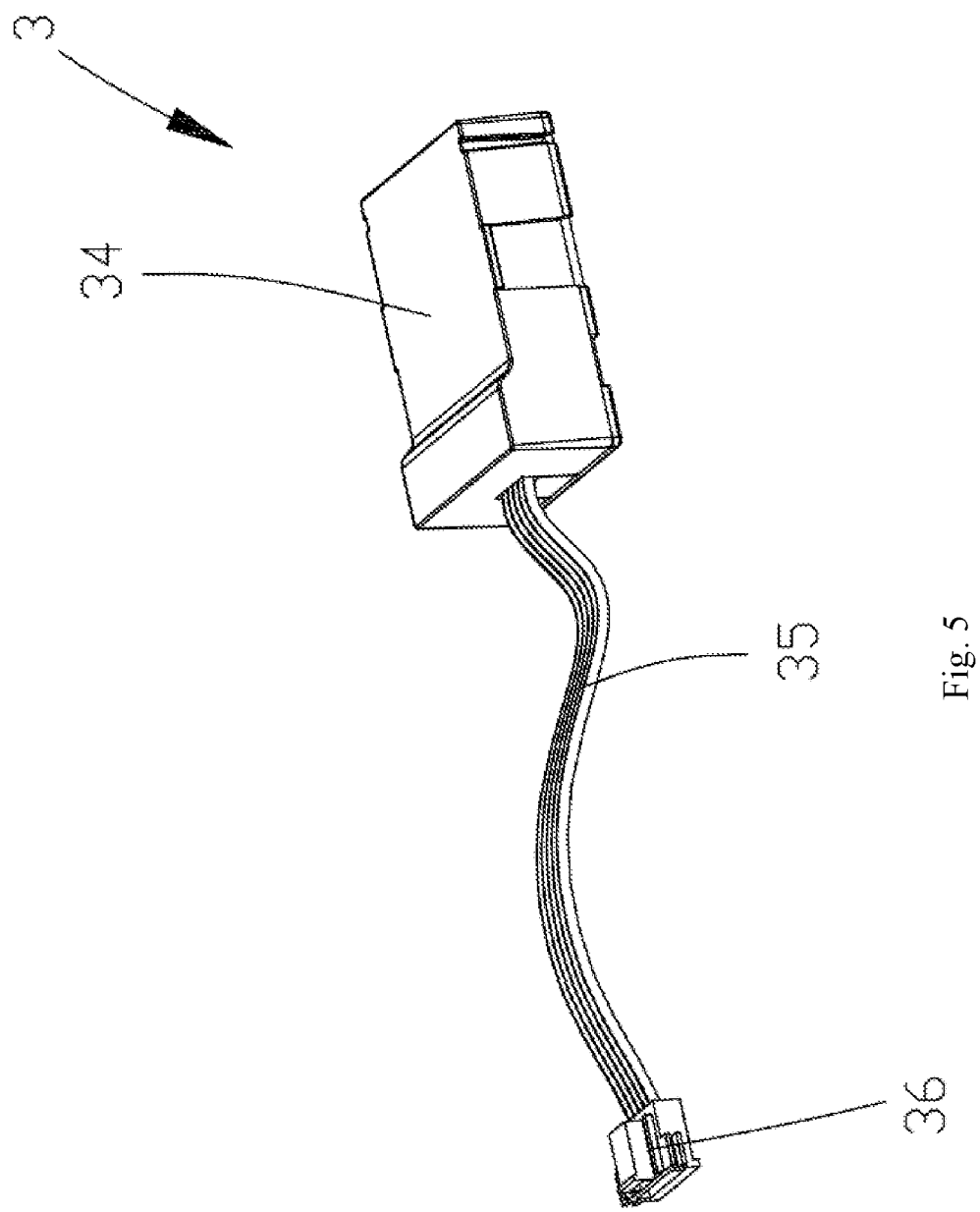
FIG. 5 is a perspective schematic view of an interface assembly of FIG. 1, according to an example of the present disclosure.
Figure 10:
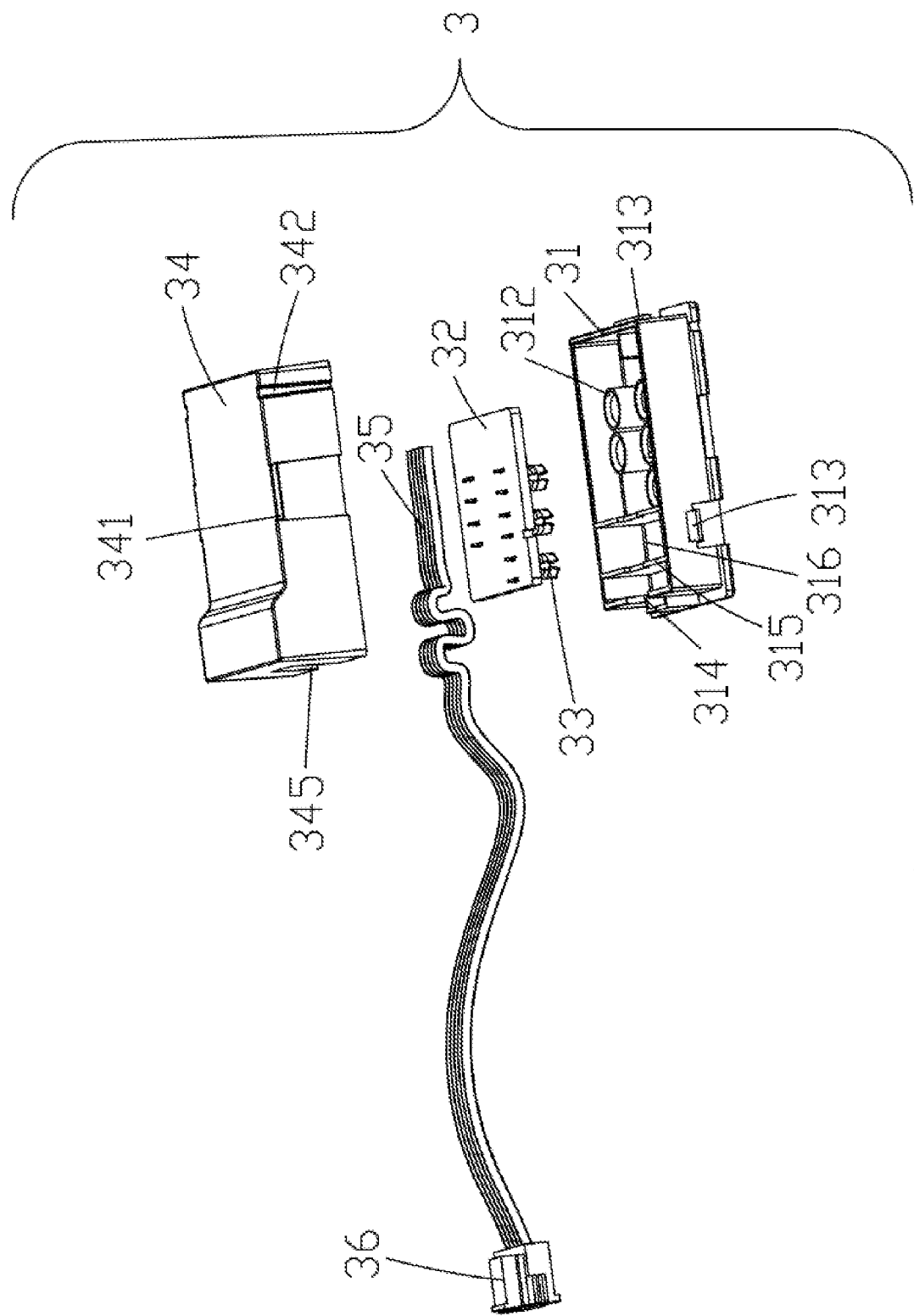
FIG. 10 is an exploded perspective view of the interface assembly of FIG. 5, according to an example of the present disclosure.
Figure 11:
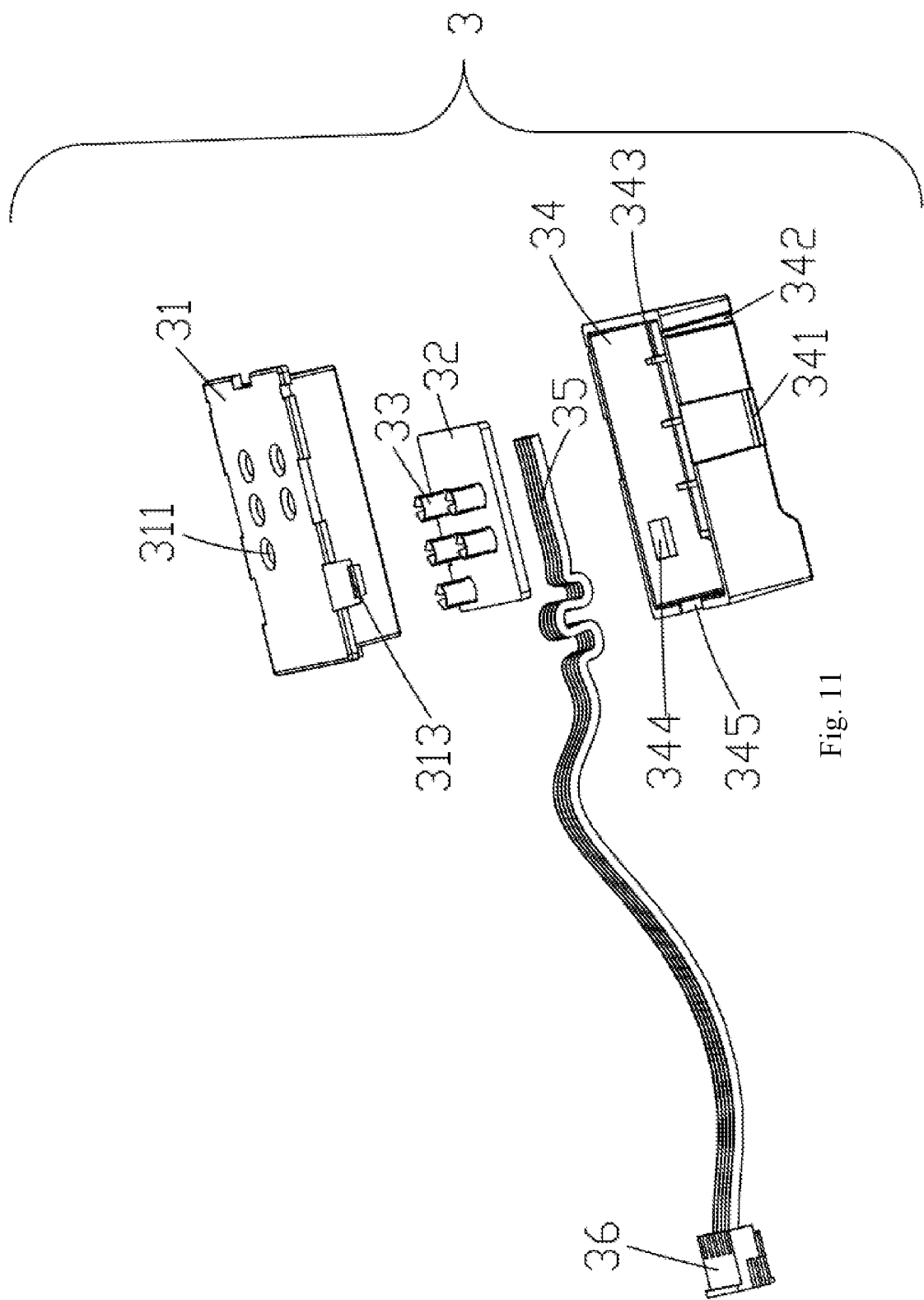
FIG. 11 is an exploded perspective view of the interface assembly of FIG. 10 viewed at another angle, according to an example of the present disclosure.

Specifically, as shown in FIG. 5, FIG. 10 and FIG. 11, the interface assembly 3 includes a lower cover 31, a second printed circuit board 32 and a third conductive terminal 33 which are received in the lower cover 31, an upper cover 34 for sealing the lower cover 31, a cable 35 electrically connected to the second printed circuit board 32 and a connector 36 electrically connected to one end of the cable 35 extending to the outside. In this embodiment, the third conductive terminal 33 is a copper pin. The third conductive terminal 33 is welded to the second printed circuit board 32 and electrically connected to the second printed circuit board 32.

Figure 13:
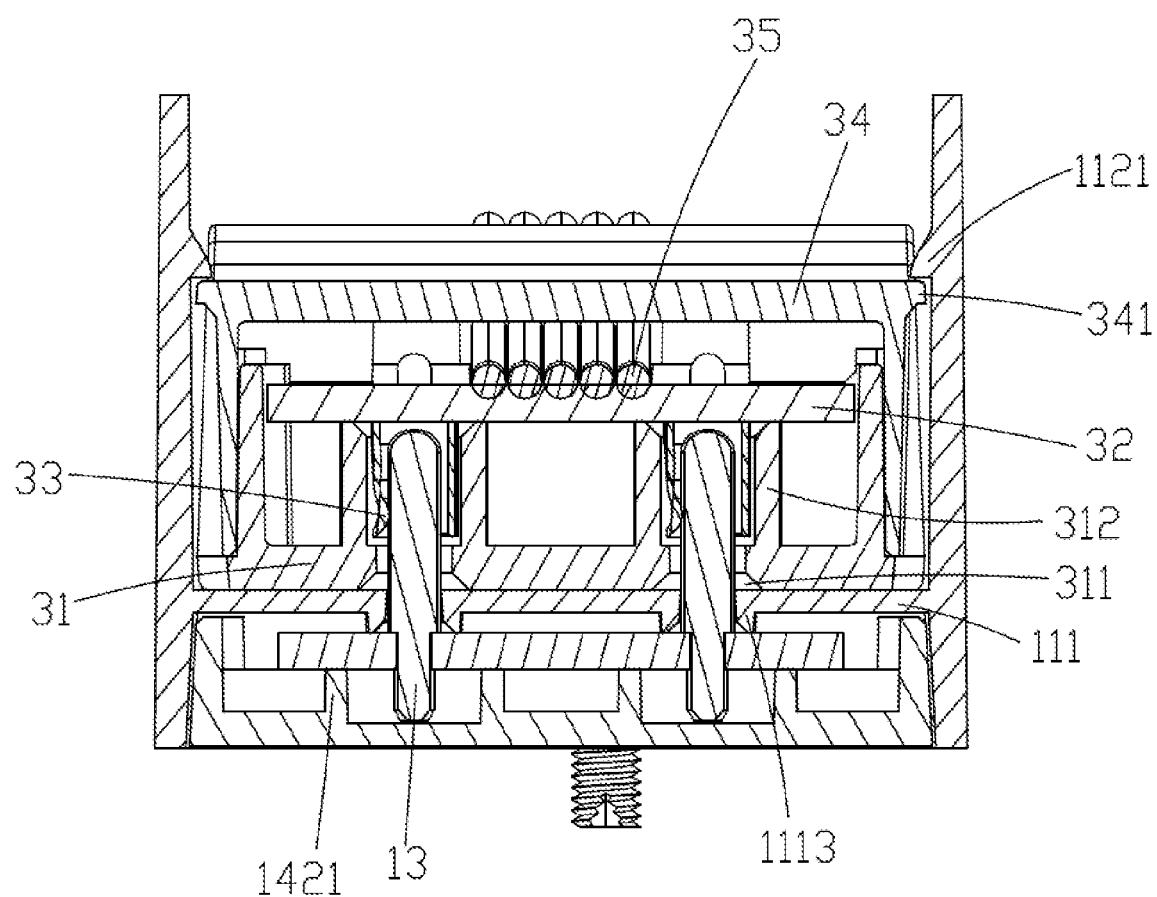
FIG. 13 is a cross-sectional view taken along line B-B of FIG. 1, according to an example of the present disclosure.

As shown in FIG. 10, the lower cover 31 is provided with a plurality of third terminal holes 311 corresponding to the third conductive terminals 33. Referring to FIG. 13, the interface assembly 3 is assembled on the electrical connector 1, one set of first conductive terminals 13 are inserted into the third conductive terminals 33 through the third terminal holes 311 to implement an electrical connection between the interface assembly 3 and the electrical connector 1. A support tube 312 corresponding to the third terminal hole 311 is inwardly provided on the bottom of the lower cover 31. The support tube 312 supports the second printed circuit board 32, and the support tube 312 is configured to receive the third conductive terminal 33. At the same time, a fourth fixture block 313 is outwardly provided on three side surfaces of the lower cover 31. The third conductive terminal 33 and the cable 35 are welded to the second printed circuit board 32. A first opening 314 is formed on the remaining side surface of the lower cover 31.

As shown in FIG. 11, the side surface of the upper cover 34 is provided with a third fixture block 341 corresponding to the first fixture block 1121, and is provided with a third groove 342 corresponding to the first positioning rib 1122. During the interface assembly 3 is mounted to the electrical connector 1, the first positioning rib 1122 is inserted into the third groove 342, so that the interface assembly 3 does not sway horizontally with respect to the electrical connector 1, and the position of the interface assembly 3 is limited in the electrical connector 1. The first fixture block 1121 and the third fixture block 341 are snap-fitted with each other, and the interface assembly 3 is fixed in the electrical connector 1. At the same time, one set of first conductive terminals 13 are inserted into the third conductive terminals 33 and electrically connected to the third conductive terminals 33 (refer to FIG. 13). A pressing post 343 is inwardly provided on the top of the upper cover 34, and the second printed circuit board 32 is sandwiched between and fixed by the pressing post 343 and the support tube 312. A fourth groove 344 corresponding to the fourth fixture block 313 is inwardly provided on the side surface of the upper cover 34, and the fourth fixture block 313 and the fourth groove 344 are snap-fitted with each other to implement a fixed connection between the lower cover 31 and the upper cover 34. The upper cover 34 is provided with a second opening 345 corresponding to the first opening 314. The first opening 314 and the second opening 345 together form a cable outlet (not labeled in the drawings), and the cable 35 passes through the cable outlet and is electrically connected to an external driving power source (not shown in the drawings) via the connector 36.

As shown in FIG. 10, the portion of the cable 35 in the lower cover 31 is bent to prevent that the electrical connection between the cable 35 and the second printed circuit board 32 is affected due to an external pull force. The lower cover 31 is provided with two supporters 315 and two slots 316 according to the bending shape of the being portion of the cable 35 to provide support for the bending portion of the cable 35; and because the height of the cable 35 on the supporter 315 is larger, the portion of the upper cover 34 corresponding to the bending portion of the cable 35 protrudes upward to provide a larger receiving space.

During the interface assembly 3 is assembled, the third conductive terminal 33 and the cable 35 are first welded to the second printed circuit board 32; then the third conductive terminal 33 is inserted into the support tube 312 of the lower cover 31, thereby the second printed circuit board 32 and the lower cover 31 are assembled; finally, the fourth fixture block 313 and the fourth groove 344 are snap-fitted with each other, the upper cover 34 and the lower cover 31 are assembled, and the cable 35 extends to the outside through the cable outlet formed by the first opening 314 of the lower cover 31 and the second opening 345 of the upper cover 34.

Compared with the existing art, the receiving slot 1111 of the electrical connector 1 of the present embodiment is fixed with the first printed circuit board 12, the first printed circuit board 12 is electrically connected with the first conductive terminal 13 extending from the receiving slot 1111 into the receiving channel 113. The first printed circuit board 12 provides the electrical connection for the first conductive terminals 13 in two electrical connecting portions. The first conductive terminal 13 is capable of being electrically connected to the light source assembly 2 or the interface assembly 3, the receiving channel 113 is provided with the first fixture block 1121, the first fixture block 1121 is capable of fixing the light source assembly 2 or the interface assembly 3. Therefore, the electrical connection circuit of the embodiment electrically connects and fixes the luminaires before the luminaire assembly is mounted, and quick mount and disassemble of various luminaires are achieved without manual wiring connection.

Figure 15:
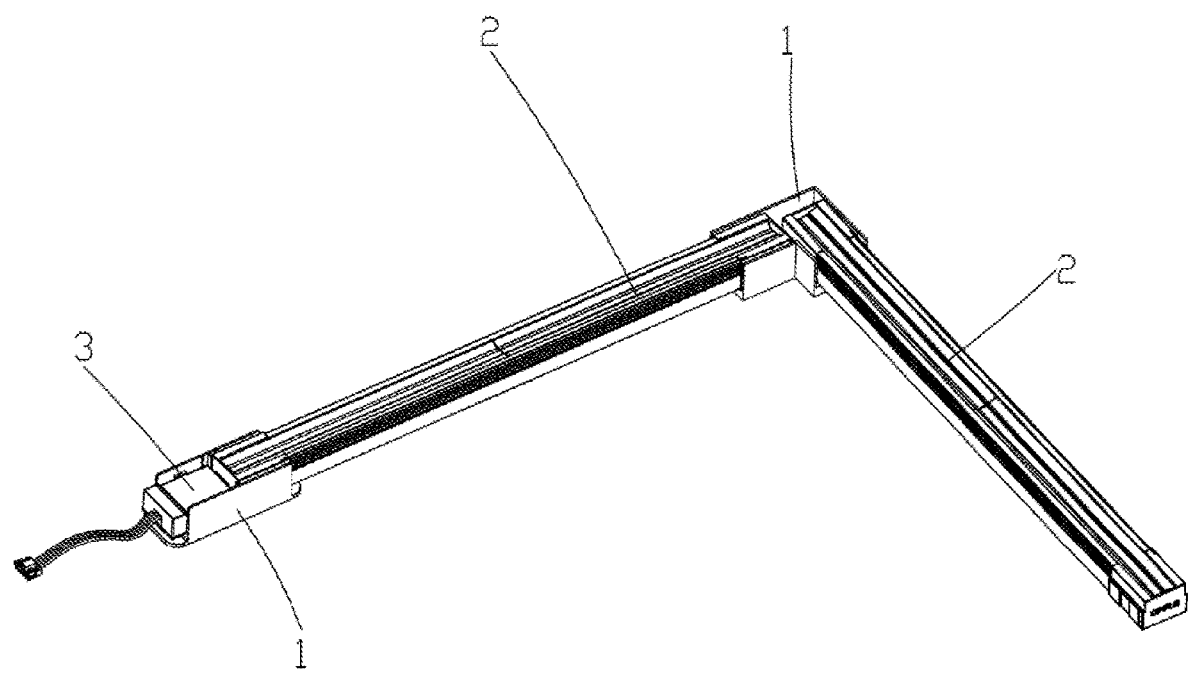
FIG. 15 a perspective schematic view of the luminaire assembly, according to an example of the present disclosure.

As shown in FIG. 15, this embodiment is similar to embodiment 1, except that the luminaire assembly of the embodiment has a right angle structure at the position of the partition plate 1123 of the first embodiment, and no partition plate 1123 is provided on the base 11 of the electrical connector 1. In this embodiment, the luminaire is mounted on working faces (not shown in the drawings), which are towards two directions, of the right angle structure. Of course, other embodiments of the present disclosure may set the degree of the included angle of two electrical connecting portions according to actual requirements, or set the amount of the electrical connecting portions according to actual requirements at the same time.

Figure 16:
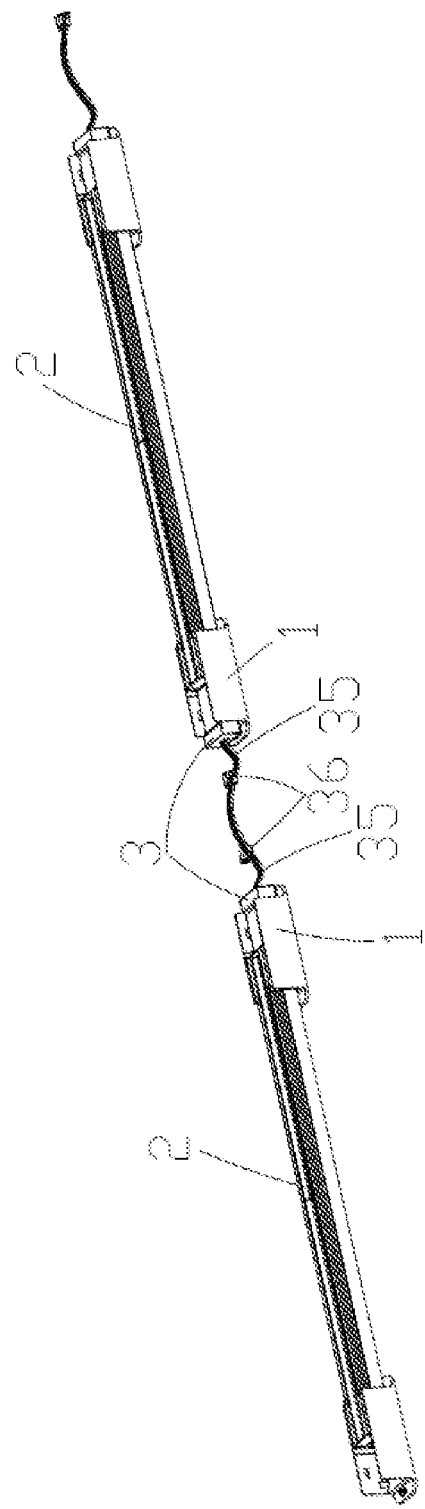
FIG. 16 is a perspective schematic view of the luminaire, according to an example of the present disclosure.

As shown in FIG. 16, this embodiment is similar to embodiment 1, except that two light source assemblies 2 of this embodiment are connected by two electrical connectors 1 and two interface assemblies 3, one end of the receiving channel of each electrical connector 1 is detachably assembled with one of the two light source assemblies 2, and the other end of the receiving channel of each electrical connector 1 is detachably assembled with one of the two interface assemblies 3, and the two interfaces assemblies 3 are electrically connected. In this embodiment, the two light source assemblies 2 are electrically connected by the cooperation of the interface assembly 3 and the electrical connector 1, the two light source assemblies 2 are electrically connected by directly connecting two cables 35, which is applicable for the case where the working surfaces of the two light source assembly 2 have different heights, or for the case where the working surface between the two light source assemblies 2 and the working surfaces of the two light source assemblies 2 have different heights, thereby the application range of the present disclosure is wider.

In summary, the first conductive terminal 13 of the electrical connector 1 is electrically connected with the light source assembly 2, so that the electrical connector 1 of the present disclosure is electrically connected to the luminaire before the luminaire assembly is mounted in the workplace, and quick mount and disassemble of various luminaires are achieved without manual wiring connection.

The above descriptions are only embodiments of the present disclosure and are not intended to limit the present disclosure. It will be apparent to those skilled in the art that various modifications and changes can be made in the present disclosure. Any modifications, equivalents, improvements, etc., made within the spirit and scope of the present disclosure, are intended to be included within the scope of the appended claims.

What is claimed is:

1. An electrical connector mounted on an installation foundation, comprising:
    a base comprising a bottom wall and two side walls, the two side walls being on two sides of the bottom wall, and the bottom wall and the two side walls defining a receiving channel, wherein the base comprises a fixed right angle structure with opposing ends facing in two directions, and the fixed right angle structure connects two light source assemblies that extend to the two directions wherein the two light source assemblies extending to the two directions form an angle in between and the angle is set according to an actual requirement;
    a first printed circuit board fixed on the base, the first printed circuit board and the receiving channel being respectively located at two sides of the bottom wall, wherein the first printed circuit board comprises a plurality of first conductive terminals and a positioning hole corresponding to a positioning protrusion disposed on the bottom wall, wherein the positioning protrusion of the bottom wall is capable of inserting into the positioning hole of the first printed circuit board; and
    the plurality of first conductive terminals electrically connected to the first printed circuit board and extending through the bottom wall of the base into the receiving channel.

2. The electrical connector of claim 1, wherein the plurality of first conductive terminals comprise two sets of first conductive terminals, the two sets of first conductive terminals are respectively located at two ends of the first printed circuit board.

3. The electrical connector of claim 1, wherein a lower surface of the bottom wall is provided with a receiving slot for receiving the first printed circuit board, and the electrical connector further comprises a pressure plate, the pressure plate is connected to the base and fixes the first printed circuit board to the base.

4. The electrical connector of claim 1, wherein at least two corresponding pairs of first fixture blocks are inwardly provided on the two side walls.

5. The electrical connector of claim 1, wherein at least one of the two side walls is provided with a first positioning rib extending inwardly.

6. The electrical connector of claim 1, wherein the electrical connector further comprises a connecting member, two connecting portions are further provided on two sides of the bottom wall, a first through hole is provided in at least one of the two connecting portions, and the connecting member passes through the first through hole to fix the base to the installation foundation.

7. The electrical connector of claim 3, wherein the base is snap-fitted with the pressure plate.

8. A luminaire assembly, comprising:
    a base comprising a bottom wall and two side walls, the two side walls being on two sides of the bottom wall, and the bottom wall and the two side walls defining a receiving channel, wherein the base comprises a fixed right angle structure with opposing ends facing in two directions, and the fixed right angle structure connects two light source assemblies that extend to the two directions wherein the two light source assemblies extending to the two directions form an angle in between and the angle is set according to an actual requirement;
    a first printed circuit board fixed on the base, the first printed circuit board and the receiving channel being respectively located at two sides of the bottom wall, wherein the first printed circuit board comprises a plurality of first conductive terminals and a positioning hole corresponding to a positioning protrusion disposed on the bottom wall, wherein the positioning protrusion of the bottom wall is capable of inserting into the positioning hole of the first printed circuit board;

the plurality of first conductive terminals electrically connected to the first printed circuit board and extending through the bottom wall of the base into the receiving channel; and a light source assembly detachably assembled in the receiving channel, an electrical connector being assembled with the light source assembly, and the light source assembly being mounted on an installation foundation by the electrical connector, wherein the light source assembly comprises the two light source assemblies.

9. The luminaire assembly of claim 8, wherein the two light source assemblies are electrically connected by one electrical connector.

10. The luminaire assembly of claim 9, wherein the electrical connector includes three electrical connectors, the three electrical connectors are respectively located at a junction of the two light source assemblies and two ends of the two light source assemblies which have been assembled.

11. The luminaire assembly of claim 8, wherein the light source assembly comprises a pedestal, an end cover and a second conductive terminal, the end cover seals the end of the pedestal, the second conductive terminal is received in the end cover, and the second conductive terminal is electrically connected with the first conductive terminal.

12. The luminaire assembly of claim 11, wherein the first conductive terminal is a copper pin and the second conductive terminal is a copper pin.

13. The luminaire assembly of claim 12, wherein a second terminal hole corresponding to the second conductive terminal is provided at a bottom of the end cover, and the first conductive terminal is inserted into the second conductive terminal through the second terminal hole.

14. The luminaire assembly of claim 8, wherein the luminaire assembly further comprises an interface assembly, the interface assembly and the light source assembly are simultaneously detachably assembled in the receiving channel of the same electrical connector and are electrically connected with the same electrical connector.

15. The luminaire assembly of claim 14, wherein the interface assembly comprises a lower cover and a third conductive terminal received in the lower cover, and the third conductive terminal is electrically connected with the first conductive terminal.

16. The luminaire assembly of claim 15, wherein the first conductive terminal is a copper pin and the third conductive terminal is a copper pin.

17. The luminaire assembly of claim 16, wherein a third terminal hole corresponding to the third conductive terminal is provided at the lower cover, and the first conductive terminal is inserted into the third conductive terminal through the third terminal hole.

18. The luminaire assembly of claim 8, wherein the luminaire assembly is a wall washer light assembly.

19. A luminaire assembly, comprising:

two electrical connectors each comprising:

a base comprising a bottom wall and two side walls, the two side walls being on two sides of the bottom wall, and the bottom wall and the two side walls defining a receiving channel, wherein the base comprises a fixed right angle structure with opposing ends facing in two directions, and the fixed right angle structure connects two light source assemblies that extend to the two directions wherein the two light source assemblies extending to the two directions form an angle in between and the angle is set according to an actual requirement;

a first printed circuit board fixed on the base, the first printed circuit board and the receiving channel being respectively located at two sides of the bottom wall, wherein the first printed circuit board comprises a plurality of first conductive terminals and a positioning hole corresponding to a positioning protrusion disposed on the bottom wall, wherein the positioning protrusion of the bottom wall is capable of inserting into the positioning hole of the first printed circuit board; and the plurality of first conductive terminals electrically connected to the first printed circuit board and extending through the bottom wall of the base into the receiving channel; and the two light source assemblies and two interface assemblies, wherein one end of a receiving channel of at least one of the electrical connectors are detachably assembled with one of the two light source assemblies, the other end of the receiving channel of at least one of the electrical connectors are detachably assembled with one of the two interface assemblies, and the two interface assemblies are electrically connected.

* * * * *